United States Patent [19]

Mau

[11] Patent Number: 5,327,366
[45] Date of Patent: Jul. 5, 1994

[54] METHOD FOR THE ADAPTIVE FILTERING OF A TRANSFORMED SIGNAL IN SUB-BANDS AND CORRESPONDING FILTERING METHOD

[75] Inventor: Mr. Joël Mau, Rennes, France

[73] Assignee: France Telecom and Teldiffusion de France S.A., France

[21] Appl. No.: 940,203

[22] Filed: Sep. 2, 1992

[30] Foreign Application Priority Data

Sep. 3, 1991 [FR] France ................................. 91 11029

[51] Int. Cl.$^5$ ............................................ G06F 15/31
[52] U.S. Cl. ................................................ 364/724.18
[58] Field of Search ............. 364/724.18, 724.1, 724.19

[56] References Cited

U.S. PATENT DOCUMENTS

| | | | |
|---|---|---|---|
| 3,883,726 | 5/1975 | Schmidt | 364/724.18 |
| 4,093,994 | 6/1978 | Nussbaumer | 364/724.18 |
| 4,218,765 | 8/1986 | Kinkade | 364/724.18 |
| 4,530,076 | 7/1985 | Dwyer | 364/724.18 |
| 4,807,173 | 2/1989 | Sommen et al. | 364/724.18 |
| 4,939,685 | 7/1990 | Feintuch | 364/724.19 |

Primary Examiner—David H. Malzahn
Attorney, Agent, or Firm—Kinney & Lange

[57] ABSTRACT

A method of filtering in sub-bands that eliminates or greatly restricts aliasing effects is disclosed. First, a source digital signal is transformed into at least two distinct frequency sub-bands. Next, each of the frequency sub-bands is filter processed. The filter processing includes the steps of defining an overall filtering profile, determining a set of partial filtering profiles each associated with one of the sub-bands, and filtering each of the sub-bands according to the associated partial filtering profile. Finally, the filtered sub-bands are reverse transformed to deliver a reconstructed filtered signal. The determined partial filtering profiles are applied so that the reconstructed filtered signal corresponds substantially to a forward filtering of the source digital signal according to the overall filtering profile. In particular, the partial filtering profiles are applied such that the aliasing terms still present after filtering are substantially compensated for.

8 Claims, 11 Drawing Sheets

METHOD FOR THE ADAPTIVE FILTERING OF A TRANSFORMED SIGNAL IN SUB-BANDS AND CORRESPONDING FILTERING METHOD

BACKGROUND OF THE INVENTION

The field of the invention is the filtering of digital signals. More specifically, the invention relates to a new method for filtering digital signals transformed into sub-bands.

In signal processing, it is common practice to transform a source signal from the temporal domain to the frequency domain. A transformation such as this has many advantages. It makes it possible to concentrate the energy of the signal on a reduced number of coefficients, and to carry out various processing operations as a function of the application, taking into account psychovisual or psychoacoustic criteria, maximum flow-rate and other criteria.

These techniques of transformation therefore find application in numerous fields. They can be used to reduce the bit-rate of a digital sound signal, for broadcasting (for example of the DAB or digital audio broadcasting type), or for storage on optical disks or on magnetic media. They also can be applied to the reduction of the bit rate of still or moving pictures. For example, they can be applied to 4.2.2 television, high-definition television, earth digital television, visiophony, telecopies, the storage of images, and other applications such as the conversion of image formats. More generally, such techniques are also used to make changes in the representation of the signal, multiplexing and demultiplexing operations such as in radar signal processing.

The invention can be applied to all of the above-mentioned fields, and to many other fields, and to many other fields as well.

Among the known transformation techniques, there are notably the block transform techniques, such as the DCT (discrete cosine transform), FFT (fast Fourier transform), DST (discrete sine transform), KLT (Karhunen and Lowe Transform) and other types; transformation techniques using the application of a bank of filters such as QMF (quadrature mirror filters), CQF (conjugate quadrature filters), PQMF (pseudo quadrature mirror filters), and many other techniques using banks of filters implementing FPR (finite pulse response) type as well as IPR (infinite pulse response) type filters. Many other means of transformation are also known and are compatible with the method of the present invention.

From a general point of view, all these transformations have the common feature of transposing the source signal towards a representation that is frequential in varying degrees while, at the same time, preserving a spatial aspect with the transformation being done locally in the signal.

Subsequently, all these techniques will be grouped together, for purposes of simplification, under generic term of "transformation into sub-bands". These transformations into sub-bands shall therefore be seen as the application of a bank of analysis filters followed by a sub-sampling for the forward transformation. For the reverse transformation, they will be seen as an over-sampling followed by a bank of synthesis filters and an addition of all the outputs of these synthesis filters.

For the forward transformation, the sub-sampled output of each filter shall be designated by the term "sub-band". This term naturally covers sub-bands delivered by a bank of filters but also covers any type of signal delivered by any transformation which may be considered to be sub-bands, and covers signals delivered by a blockwise transformation, also called transformed coefficients.

The usefulness of splitting up a signal into sub-bands is based upon the fact that these sub-bands are sampled at a frequency below the sampling frequency of the source signal. It is clear that it is easier to carry out processing operations on sampled sub-bands which are at a lower frequency than on the original signal. It is also easier because usually, only certain sub-bands undergo a particular processing operation.

In a standard way, as shall be seen in greater detail hereinafter with reference to FIGS. 1 to 8, the processing of the sub-bands according to the known prior art methods, consists simply of the multiplication of certain of the sub-bands by a given weighting coefficient. This enables the reduction, and even the cancellation, of certain of the sub-bands.

However, these techniques have one major drawback. During the reconstruction of the signal, namely after the attenuation of certain sub-bands, "pollution" terms appear (see for example FIG. 8, terms 81 to 84) due to the phenomenon of aliasing. Techniques described below have been found to attenuate the extent of the aliasing terms. However, these techniques imply a larger number of aliasing terms with lower values. Furthermore, the filtering operations performed by means of these known techniques are often highly selective in frequencies. This prompts ripple phenomena around contours, notably in the case of image processing.

The invention provides a method for filtering a signal transformed into sub-bands that can be used to obtain a reconstituted signal that is undisturbed or little disturbed by aliasing terms. The filtering method permits the use of a very large number of filtering profiles associated with one or more sub-bands, particularly profiles of the following types: low-pass, high-pass, pass-band, rejection, and multi-band of the type accentuating or attenuating certain bands.

The invention also provides a method based on a bank of filters that is simple to implement, easy to install, particularly on an integrated circuit and greatly limits the number of multiplications needed for implementation.

The invention also provides a method of performing an adaptive filtering operation and of varying the adaptive filtering operation as a function of a maximum bit rate or of an information element related to the analysis of the signal to be filtered.

The invention also provides a method of smoothing or attenuating filtering profiles that introduce no contour ripple phenomena (in image processing) which are generally prompted by highly selective filters such as PQMF filters, used to split signals into sub-bands.

The invention can be used in various applications, including sound or image (still or moving image) processing, multiplexing, multidimensional signal processing, or other types of applications. The invention makes it possible carry out conversions of image formats, notably for interleaved images, without introducing flickering into the image. The invention may be implemented in integrated circuits.

SUMMARY OF THE INVENTION

The method of filtering a digital source signal of the present invention includes transforming the digital source signal from a temporal domain signal into a frequency domain signal having at least two frequency sub-bands. An overall filtering profile is defined which corresponds to a filtering operation designed to be applied to the source digital signal. A set of partial filtering profiles based upon the overall filtering profile is determined, with each partial filtering profile corresponding to a particular frequency sub-band. Each frequency sub-band is filtered based upon a corresponding partial filtering profile. One or more of the filtered frequency sub-bands have aliasing terms as a result of filtering based upon the corresponding partial filtering profiles. The filtered sub-bands are transformed from the frequency domain into filtered temporal domain signals. An output signal, constructed from the filtered temporal domain signals, is provided. The output signal corresponds substantially to a forward filtered digital source signal filtered based upon the overall filtering profile.

DETAILED DESCRIPTION OF THE PREFERRED EMBODIMENTS

Figure 1:
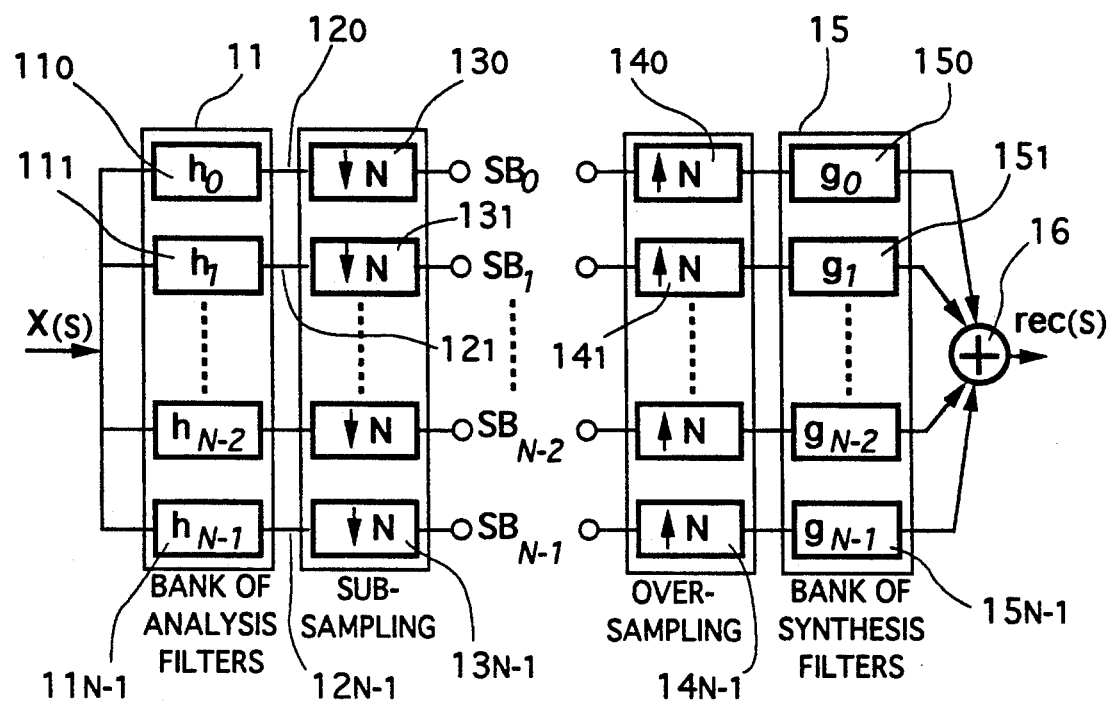
FIG. 1 is a block diagram illustrating the general principle of prior art transformations of temporal domain source signals into frequency domain sub-bans.

FIG. 1 illustrates a known method of implementing the general principle of transforming a signal into frequency sub-bands. The source digital signal x(s) is input into a bank of filters 11 that comprises a series of N analysis filters $11_0$ to $11_{N-1}$ (each with a response $h_0$ to $h_{N-1}$, respectively) which process the source signal x(s) in parallel. These analysis filters often have equal bandwidths but this condition is in no way necessary.

Although described here in terms of a one-dimensional signal, the technique can be extended to two-dimensional and multidimensional signals.

The bank of filters 11 delivers N signals, $12_0$ to $12_{N-1}$, at a sampling frequency $f_s$ equal to the frequency of the source signal x(s). The bank of filters has the characteristic of providing sub-bands at a lower sampling frequency. It is known that it is possible, with a minimum loss (or zero loss, in theory) of significant information, to change from a signal x(s) at the frequency $f_s$ to N signals in sub-bands each at the frequency $f_s/N$. In the particular example illustrated in FIG. 1, the signal is transformed to a signal with N sub-bands of equal widths. This characteristic proves to be particularly advantageous when only certain of the sub-bands undergo a particular processing operation. The particular processing operation is then carried out at the frequency $f_s/N$ and no longer at the frequency $f_s$.

To achieve this change of frequency, each signal $12_0$ to $12_{N-1}$ is sub-sampled by a factor N by a sub-sampling module ($13_0$ to $13_{N-1}$), the outputs of which deliver N sub-bands $SB_0$ to $SB_{N-1}$. It is these sub-bands that the invention proposes to filter.

The reconstruction of the signal is done symmetrically by N oversampling modules $14_0$ to $14_{N-1}$, bringing each of the sub-bands $SB_0$ to $SB_{N-1}$ to the original frequency $f_s$ and by means of a bank of filters 15, comprising N synthesis filters $15_0$ to $15_{N-1}$ (with respective responses $g_0$ to $g_{N-1}$). The signals coming from filters 15 are then added in summator 16, which generates and delivers the reconstituted signal rec(s).

To specify the context of the invention with greater precision, a brief description of the signals found at the terminals of the different modules of the system of FIG. 1 is provided. To this end, a frequency representation is used, the signals being described by their spectrum, without taking account of their phase.

Figure 2:
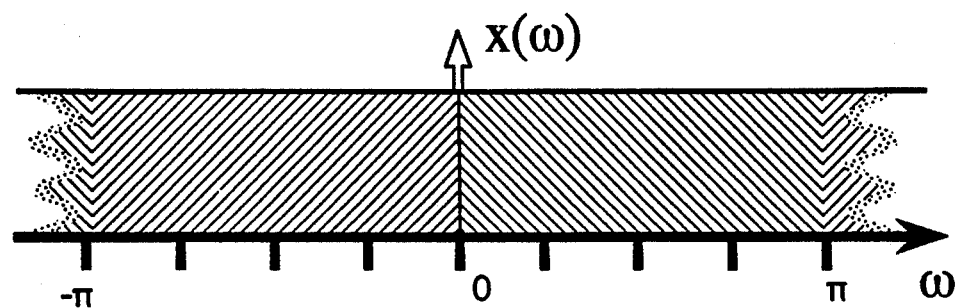
FIG. 2 is a diagrammatic representation illustrating the spectrum of an input source signal before analysis filtering.

The spectrum $X(\omega)$ of the digitized input signal x(s) is shown in FIG. 2. It will be noted that since the signal is digitized, the spectrum is periodic with a period of $2\pi$, as indicated by the hatched lines inclined to the right and to the left, respectively. It should be noted, hereinafter, that all the signals described are periodic with a period of $2\pi$.

The signal x(s) is filtered by the bank of filters 11. To simplify the description, the case considered here is that of a transformation by filters 11 into only four sub-bands with identical widths. It is, however, easy to extend the concept to other examples with more or less sub-bands.

Figure 3:
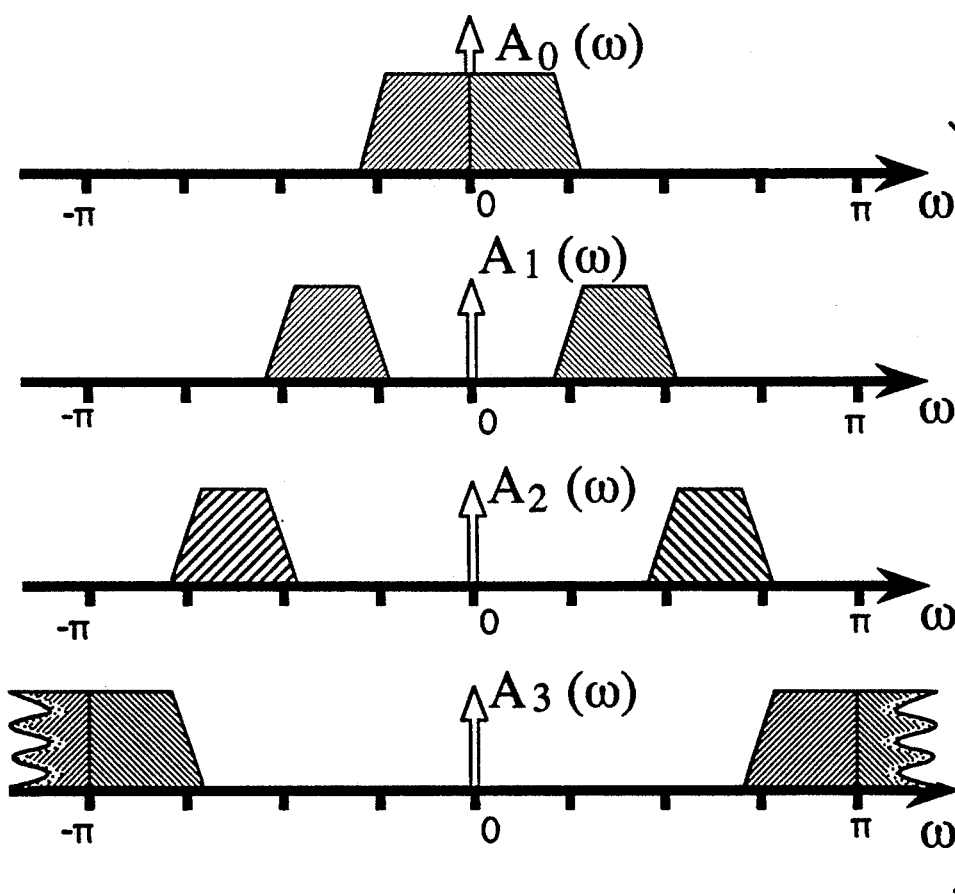
FIG. 3 is a diagrammatic representation of the spectra of a source signal after analysis filtering.
Figure 4:
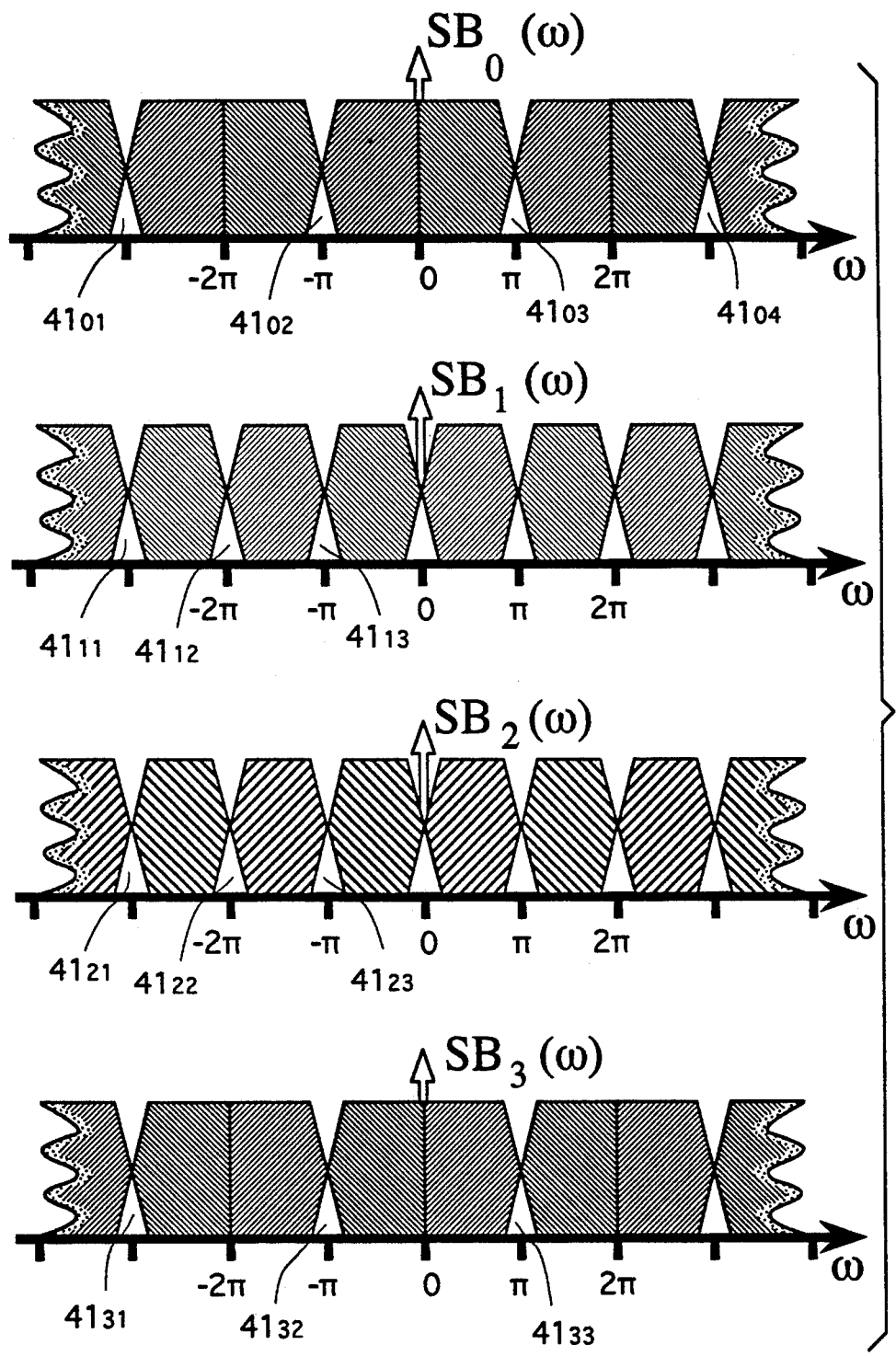
FIG. 4 is a diagrammatic representation of the spectrum of a source signal after analysis filtering and sub sampling.

FIG. 3 illustrates the four signals $A_0(\omega)$ to $A_3(\omega)$ obtained at the output of the bank of filters 11. These signals are then sub-sampled by modules $13_0$ to $13_3$. The sub-sampling leads to a repetition of the original spectrum in the frequency field capable of resulting in aliasing terms. The spectrum of the four sub-bands $SB_0(\omega)$ to $SB_3(\omega)$ delivered sub-sampling modules 13 are shown in FIG. 4.

It can be appreciated that the copying of the basic spectra leads to the phenomenon of aliasing (the spectra overlap one another). In FIG. 4, the main aliasing terms $41_{0j}$ to $41_{3j}$ (where $1 \leq j \leq 3$) are the only ones shown. However, in reality, there are also secondary aliasing terms which, for purposes of simplification, are not shown. These secondary aliasing terms, as well as the main aliasing terms, may all be reduced by using selective filters, as in the case of PQMF filter banks for example.

The four sub-bands $SB_0$ to $SB_3$, which are the output signals of the forward transformation, may be modified and processed differently according to each of the various applications using this transformation.

Figure 5:
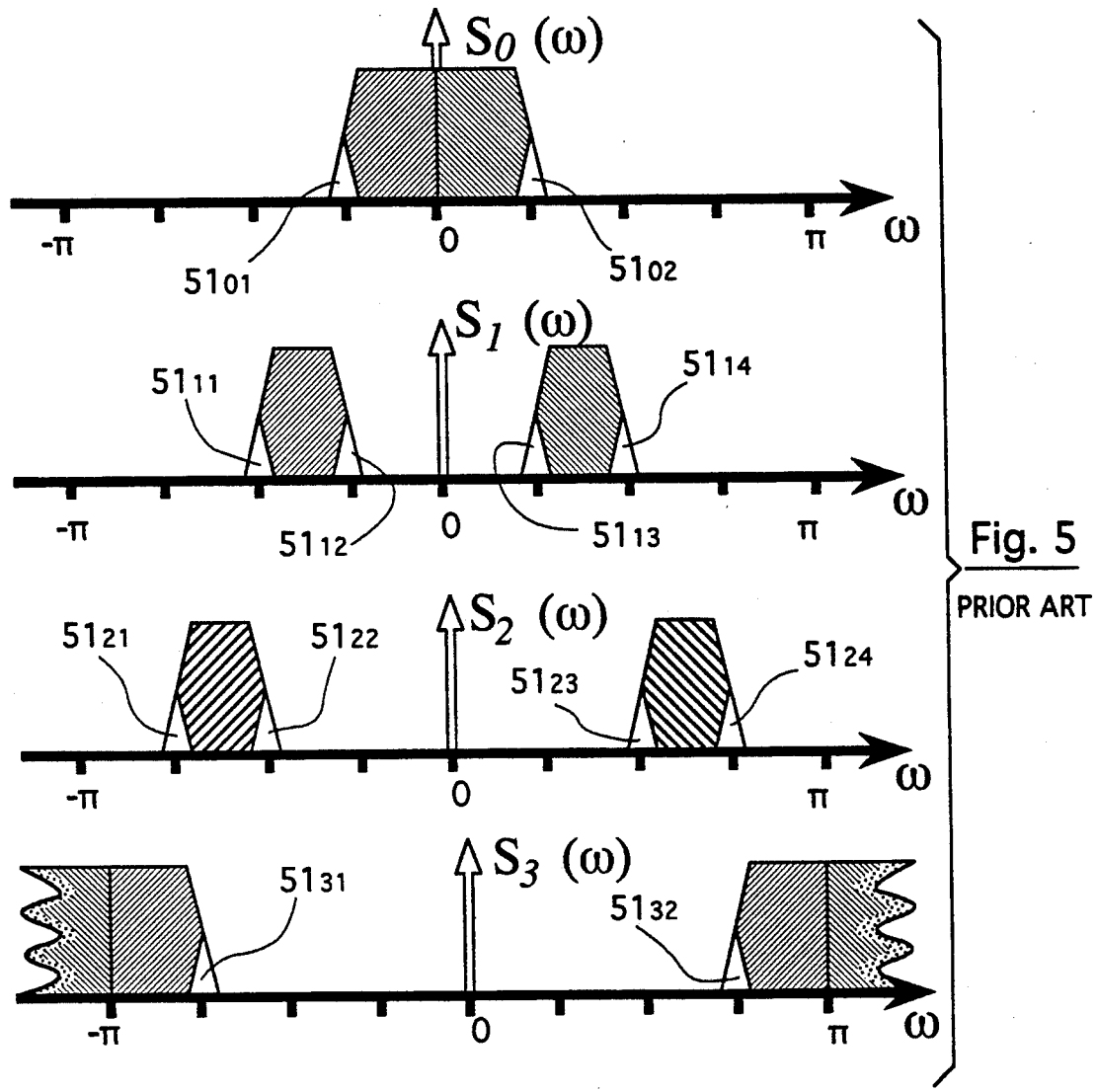
FIG. 5 is a diagrammatic representation of the spectrum of a source signal after analysis filtering, sub sampling and synthesis filtering.

Should no processing be done, the reverse transformation makes it possible to obtain a reconstructed signal rec(s) that is identical, or nearly identical (with the exception of a time interval), to the input signal x(s). In this instance, the reconstructed signal rec(s) is nearly identical despite the presence of the different aliasing terms $51_{ij}$ of the spectra $S_0(\omega)$ to $S_3(\omega)$ as shown in FIG. 5. These spectra have aliasing terms $51_{ij}$. However, aliasing terms $51_{ij}$ will compensate for each other in sets of two during the summation by summator 16 because for they have the same amplitude and different phases.

More specifically, the compensations are as follows:
aliasing terms $51_{01}$ and $51_{02}$ with aliasing terms $51_{12}$ and $51_{13}$ respectively;
aliasing terms $51_{11}$ and $51_{14}$ with aliasing terms $51_{22}$ and $51_{23}$ respectively;
aliasing terms $51_{21}$ and $51_{24}$ with aliasing terms $51_{31}$ and $51_{32}$ respectively.

Figure 6:
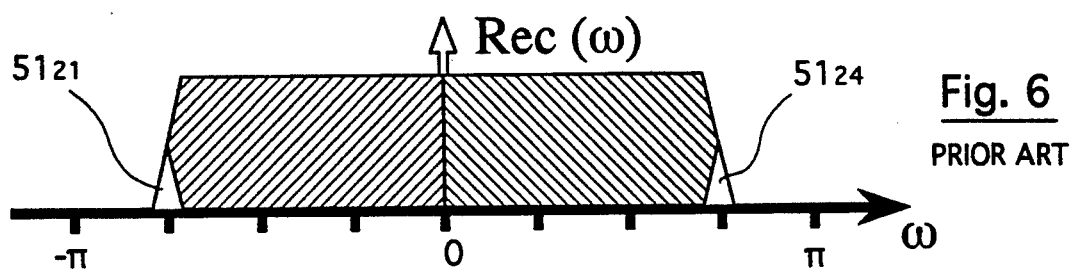
FIGS. 6–8 are diagrammatic representations of examples of spectra of signals filtered according to prior art methods.

As a result, the reconstituted signal shown in FIG. 6 closely corresponds to the original signal as shown in FIG. 2. In contrast, according to previously known sub-band filtering techniques, if one of the sub-bands $SB_0$ to $SB_3$ undergoes processing, the above-mentioned compensations are not done, or at least they are not done completely. The reconstructed signal is therefore polluted to varying degrees during these previously known filtering techniques.

Analysis or synthesis filtering is aimed at achieving a transformation. On the other hand, sub-band filtering operations are aimed at modifying the signal, for example by the quantity of information needed in order to reduce the bit rate. Thus, if it is desired to make a ¾ band filter by eliminating a quarter of the highest frequencies, it is sufficient, in principle, to cancel the sub-band $SB_3(\omega)$ by multiplying it by zero. The filtering, therefore, proves to be particularly simple. Moreover, filtering is accomplished at a frequency that is four times lower than the sampling frequency of the source signal. However, it is clear that the aliasing terms $51_{21}$ and $51_{24}$ of the sub-band $S_2(\omega)$ will no longer be compensated for since the aliasing terms $51_{31}$ and $51_{32}$ have been eliminated. Therefore, the aliasing terms $51_{21}$ and $51_{24}$ will appear in the spectrum of the reconstituted signal illustrated in FIG. 6. Furthermore, in the case of a simple cancellation of sub-bands, if the sub-band filters used are highly frequency selective, there is a risk that the reconstructed signal may show ripples around the contours when the filtering is applied to the processing of images.

Figure 7:
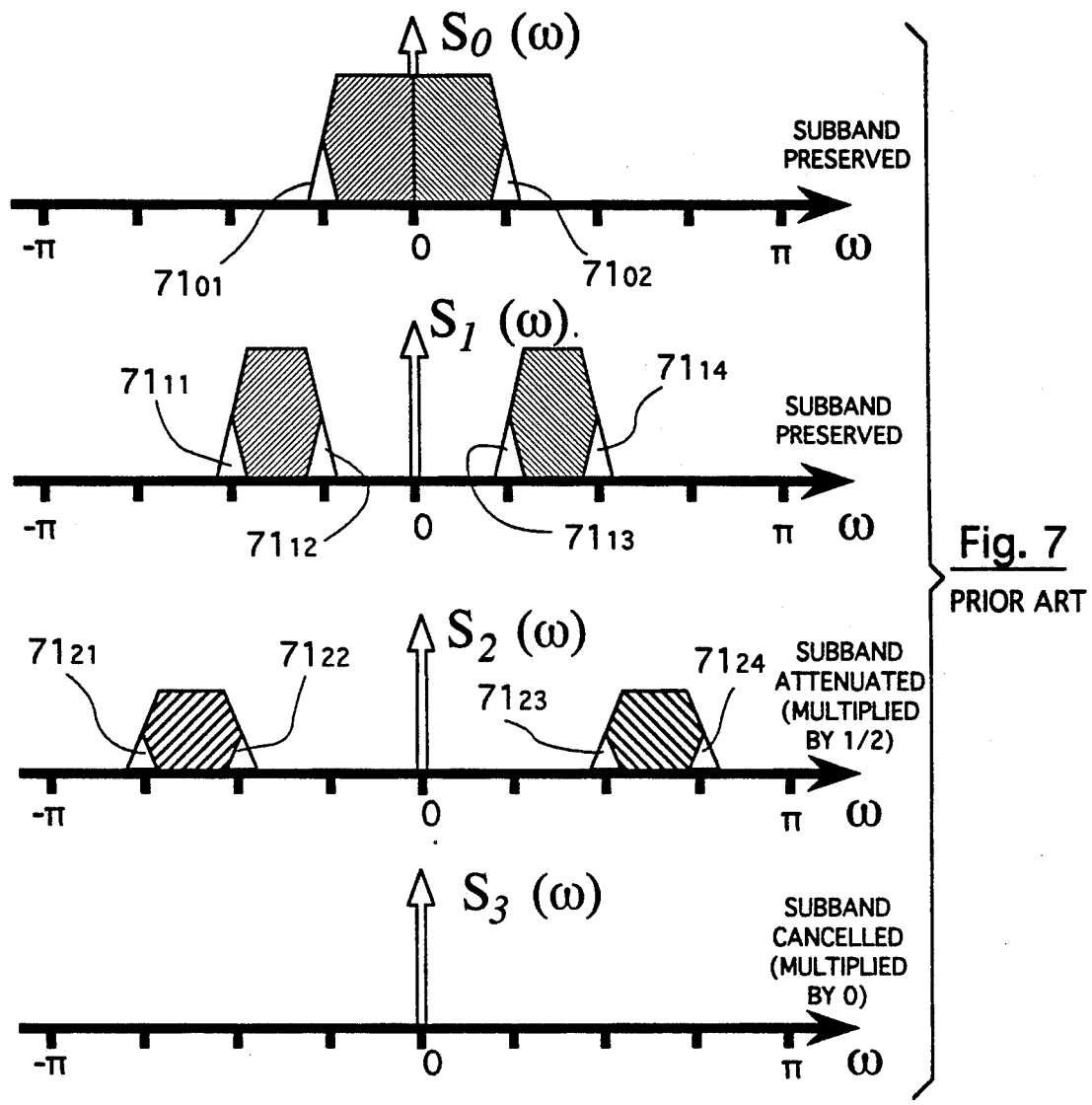
Figure 8:
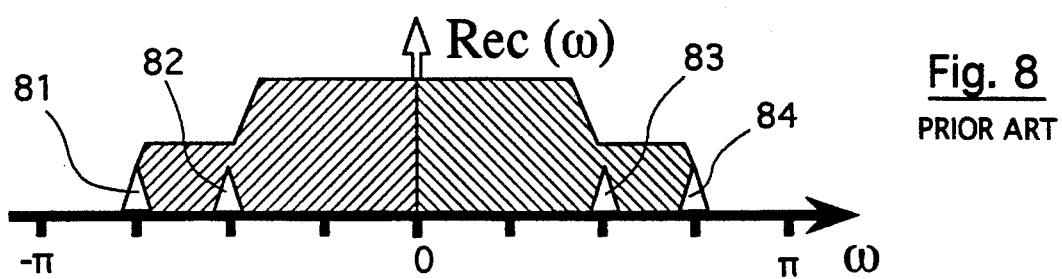

To obtain a less selective filter in the frequency domain, and hence smaller ripples around the contours, it is possible, for example, to cancel $SB_3$ and to multiply $SB_2$ by ½. This processing operation is illustrated in FIG. 7 (after synthesis filtering). The spectrum reconstituted after the addition of the filtered sub-bands of FIG. 7 is shown in FIG. 8. The overall filter is less selective, but the problems of disturbances introduced by aliasing terms persist and even increase. Since these aliasing terms no longer have the same amplitude before the final addition of the bands, they can no longer compensate for one another.

Thus, in FIG. 7, the aliasing terms $71_{21}$ and $71_{24}$ of the sub-band $S_2$ have no correspondents in the sub-band $S_3$ and are therefore present in the final spectrum shown in FIG. 8 as aliasing terms 81 and 84. Similarly, aliasing terms $71_{22}$ and $71_{23}$ are only partially compensated with aliasing terms $71_{11}$ and $71_{14}$ of the sub-band $S_1$ which has undergone no processing. Therefore, the reconstructed spectrum shown in FIG. 8 also includes two residue aliasing terms 82 and 83. If the source filter signal x(s) is subjected to forward filtering with a filter having the profile shown in FIG. 8, the different terms 81 to 84 would not exist.

The invention provides a new method of filtering in sub-bands, that can be used to obtain an overall filtering profile that is undisturbed, or is disturbed very little, by aliasing terms. Furthermore, the filtering method of the present invention enables the production of a very large number of filtering profiles, the filtering profiles being far more varied than those obtained conventionally according to the prior art methods discussed above which use multiplication by a weighting coefficient for certain sub-bands.

According to the prior art, the N signals of sub-bands coming from the bank of analysis filters are independent. The processing of each signal therefore actually corresponds to N particular processing operations carried out in parallel, independently of one another.

The present invention processes the several sub-bands such that the processing applied to a given sub-band systematically influences the processing applied to one or more of the other sub-bands and particularly to the neighboring frequency bands. In other words, the filtering applied to each sub-band may be dictated by the filtering applied to the neighboring sub-bands so that the aliasing terms cancel out during the reconstruction.

In the present invention, the sub-bands are no longer simply multiplied by an attenuating coefficient, but rather, they undergo a particular adaptive filtering. It will be noted that, in this way, numerous types of filters may be generated.

Figure 15:
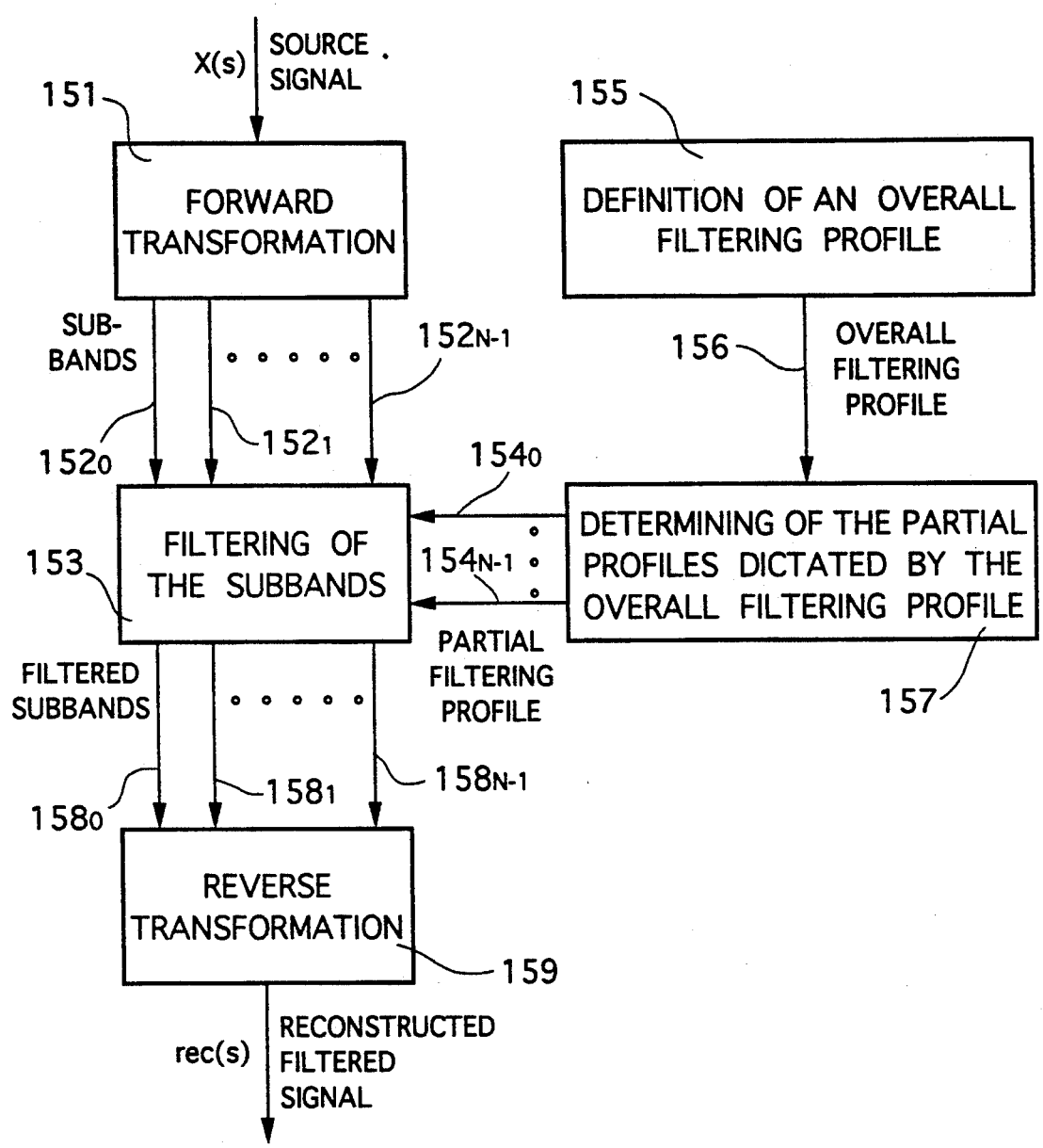
FIG. 15 is a block flow diagram illustrating the general principle of adaptive filtering according to the present invention.

FIG. 15 shows a block diagram of a filtering method according to the present invention. Source signal x(s) is transformed, during forward transformation step 151, into frequency sub-bands $152_0$ through $152_{N-1}$ by any of numerous transformation techniques such as filtering in sub-bands and mathematical transformation. Next, during step 153, each of sub-bands $152_0$ through $152_{N-1}$ is filtered based, at least in part, upon a corresponding partial filtering profile $154_0$ through $154_{N-1}$ associated with each of the respective sub-bands. Determining partial filtering profiles $154_0$ through $154_{N-1}$ begins in step 155 with the definition of a predetermined overall filtering profile 156. Overall filtering profile 156 is designed to filter source signal x(s), and is not designed to provide independent filtering of each of sub-bands $152_0$ through $152_{N-1}$.

On the basis of overall filtering profile 156, a determination of partial filtering profiles $154_0$ to $154_{N-1}$ is made during step 157, with each of partial filtering profiles $154_0$ through $154_{N-1}$ being designed to filter one of sub-bands $152_0$ through $152_{N-1}$. The principal characteristic of determining the partial filtering profiles in step 157 is that the determination is dependent upon the desired overall filtering profile 156. This means that, unlike in prior art filtering methods which are limited to applying weighted coefficients to each sub-band, in the present invention specific filtering profiles $154_0$ to $154_{N-1}$ are computed. As a result, different filtered sub-bands $158_0$ to $158_{N-1}$ undergo a reverse transformation at step 159 which is the reverse of the forward transformation at step 151. The reconstructed filtered signal rec(s) is identical, or at least very close, to a signal which would correspond to source signal x(s) after forward filtering according to overall filtering profile 156.

In particular, step 157 should therefore generate each partial profile $154_0$ through $154_{N-1}$ so that the aliasing terms appearing during filtering step 153 of the sub-bands are compensated for during the reconstruction by reverse transformation step 159. Thus, an essential characteristic of the invention is that the determination of a partial filtering profile is based partially upon one or more of its neighboring partial filtering profiles along the frequency axis.

It should be noted that it is not necessary to eliminate or attenuate the aliasing terms present in each filtered sub-band. Thus, the aliasing terms in each filtered sub-band need not be limited, but instead are arranged so that aliasing terms that appear in the different sub-bands compensate or cancel one another during reconstruction of the signal in reverse transformation step 159. As a consequence, determination of the partial filtering profiles may, in certain cases, result in deliberate amplification of aliasing terms in order to compensate for other aliasing terms.

Figure 9:
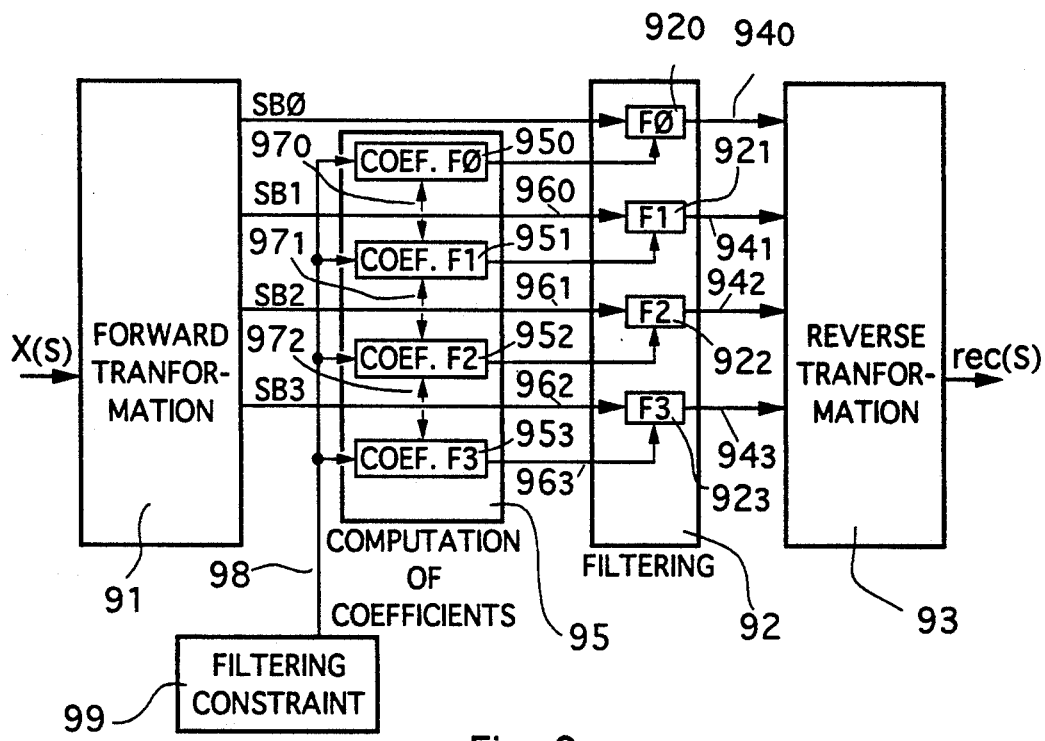
FIG. 9 is a block diagram of an adaptive filtering device according to the present invention.

FIG. 9 illustrates a device implementing the principle of the present invention using the previous example of four sub-bands. In FIG. 9, source signal x(s) is transformed by a bank of analysis filters 91 or by any other means of transformation. Bank of filters 91 delivers four sub-bands $SB_0$ to $SB_3$ which are directed towards a filtering module 92, with filtering module 92 comprising four independent filters $92_0$ to $92_3$ (F0 to F3).

The filtered signals $94_0$ to $94_3$ from filtering module 92 next undergo a reverse transformation by bank of files 93, for example, by a bank of synthesis filters which delivers the reconstituted signal rec(s). It should be noted that filtered signals $94_0$ to $94_3$ are not generally retransformed into the temporal domain immediately after filtering but, on the contrary, undergo other processing operations. For example, they may undergo operations intended to obtain a bit rate reduction in a sound or image coder/decoder system. In other words, bank of analysis filters 91 and filtering module 92 correspond to the sending or coding part of a system and bank of synthesis filters 93 corresponds to the reception or decoding part of the system.

The apparatus of the present invention also comprises a module 95 for the computation of filtering coefficients. Schematically, it may be considered that module 95 comprises four sub-modules (more generally, as many sub-modules as sub-bands) $95_0$ to $95_3$, each delivering the respective coefficients $96_0$ to $96_3$ of each filter $92_0$ to $92_3$.

According to the invention, computation of the coefficients takes account of the neighboring sub-bands. Therefore, each computation module $95_0$ to $95_3$ takes into account, in its computation of information elements $97_0$ to $97_2$ which represent the profile computed for the various sub-modules $95_0$ to $95_2$. For example, information elements $97_0$ to $97_2$ may represent the values of the coefficients determined by these modules.

It should be noted that the computation of coefficients can be done differently, for example, by a single computation module. As will become evident, a single computation module may compute the coefficients by applying the rule of "horizontal tangents".

In other embodiments, the values of the coefficients may be fixed. In these embodiments, module 95 can be, for example, a simple memory location or device storing precomputed values. However, in preferred embodiments, these values are variable, as a function of one or more criteria 98 delivered by a module 99 which determine a filtering constraint. It is therefore possible to take into account, for example, a fixed bit rate and psychoacoustical or psychovisual criteria, such as quantity of motion in an image.

In one embodiment, module 95 is a memory containing several filtering values, and module 99 selects one of the values. In a more complex embodiment, computation module 95 may be a computer which makes realtime determinations of optimal filtering coefficients.

Two examples of filterings obtained according to the method of the present invention may now be described. The methods provide filtering profiles close to those which correspond to the two prior art filtering examples discussed earlier, however, with two essential differences. First, with filterings obtained according to the present invention, there are no longer any disturbances due to aliasing terms in the reconstructed signal. Second, the overall filtering profile shows frequency transitions that are far smoother than the prior art.

Figure 10:
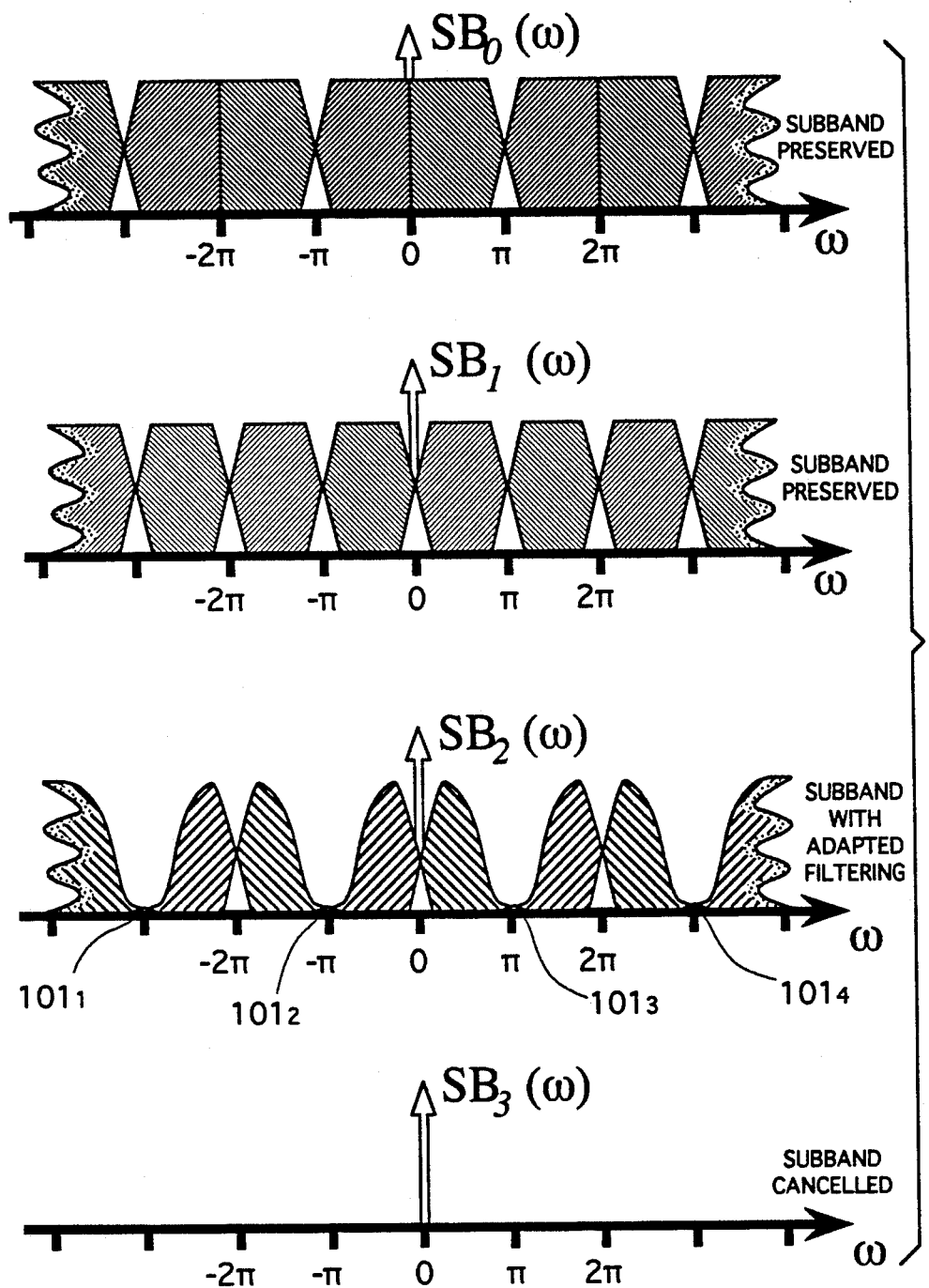
FIG. 10 is a diagrammatic representation of the spectra of sub-bands after adaptive filtering in accordance with the present invention.

A first filtering example according to the present invention, illustrated in FIGS. 10 to 13, is a ¾ band low-pass filter. As shown in FIG. 10, the sub-band $SB_3$, corresponding to the high frequencies, is zero-set, just as in the prior art example described earlier. However, the neighboring sub-band $SB_2$ undergoes a particular filtering which enables the substantial attenuation of aliasing terms $101_1$ to $101_4$, which no longer have corresponding terms in sub-band $SB_3$.

An essential characteristic of the invention is that at least one of the sub-bands ($SB_2$ in the first example) undergoes adaptive filtering as opposed to the simple multiplication of prior art filters.

The filter used in the first example is a low-pass filter, for example with coefficients [¼, ½, ¼].

Figure 11:
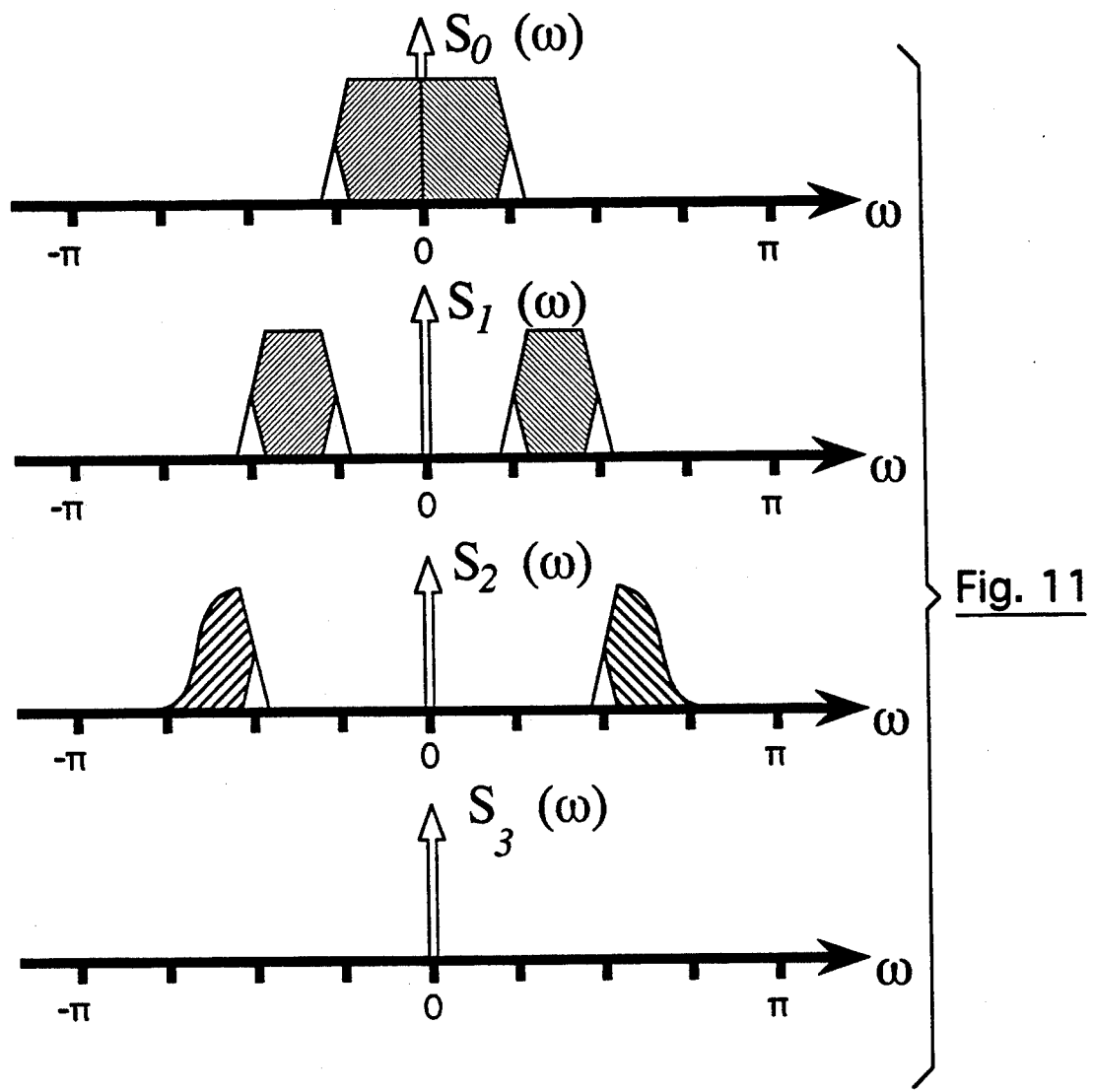
FIG. 11 is a diagrammatic representation of the spectra of sub-bands after synthesis filtering according to the present invention.

FIG. 11 shows signals $S_0$ to $S_3$ obtained after synthesis filtering of sub-bands $SB(\omega)$ to $SB_3(\omega)$. It can be appreciated that the adaptive filtering illustrated in FIG. 10 results in preservation of certain aliasing terms so that they may be canceled out in pairs leaving few or no "polluting" aliasing terms. Indeed, the low-pass filtering of the sub-band $SB_2$ has, to a great extent, eliminated the frequency zone in which there resided the non-compensated aliasing terms. Therefore, the spectrum of the reconstructed signal, shown in FIG. 12, no longer includes aliasing terms. In practice, very weak aliasing term disturbances $121_1$ to $121_4$ may remain, but they are in no way comparable to those appearing in the prior art filtering methods as illustrated in FIG. 6.

Figure 12:
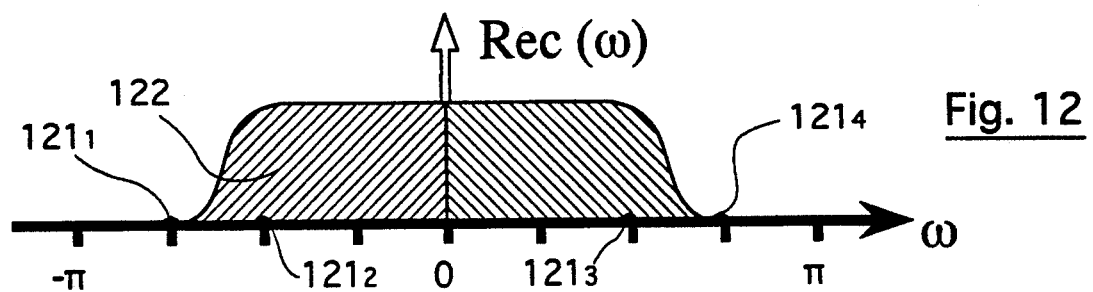
FIG. 12 is a diagrammatic representation of the spectrum of a reconstructed signal filtered in accordance with the present invention.

Furthermore, it is observed again with reference to FIG. 6, that the frequency transition 122 of the filtering method of the present invention shown in FIG. 12 is smoother than the prior art methods. This is an advantageous result.

Figure 13:
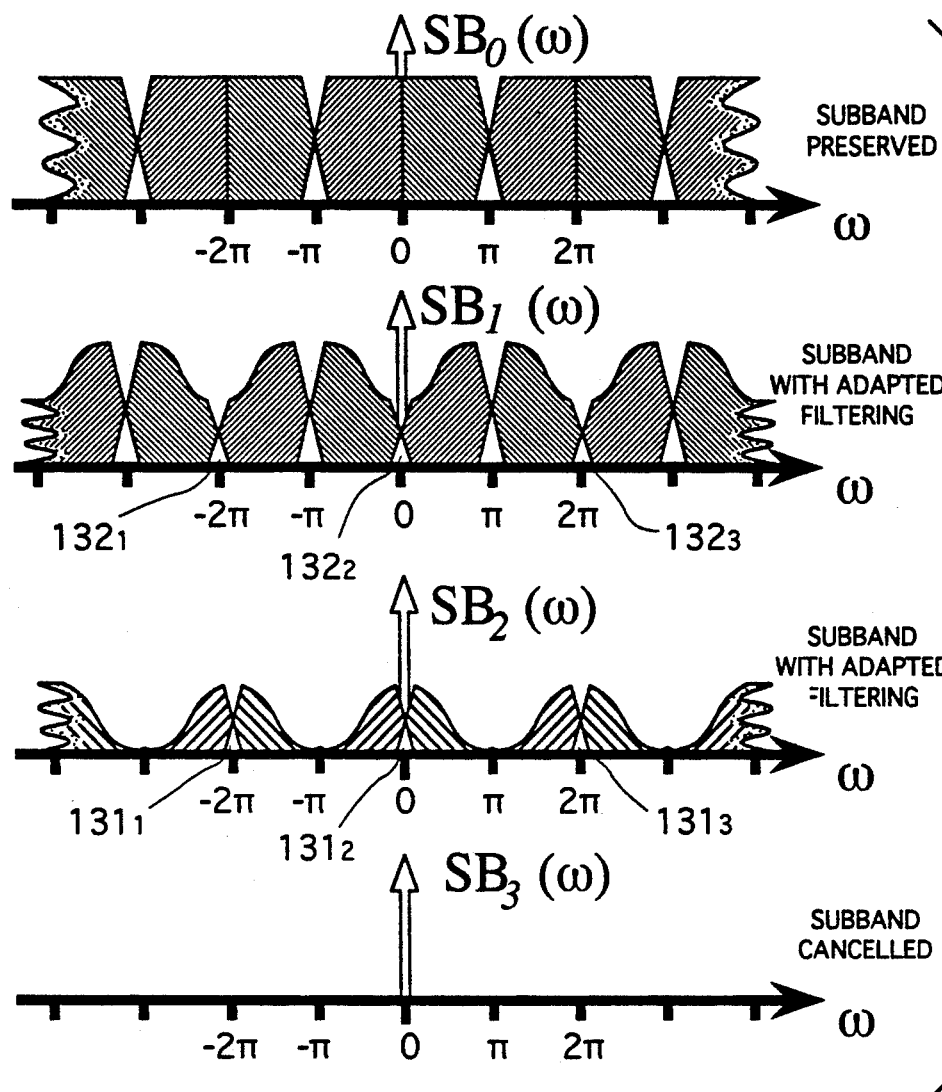
FIGS. 13–14 are diagrammatic representations of an implementation of a preferred embodiment of the present invention with a smooth filtering profile.

According to the invention, the filtering profile of each sub-band is dictated as a function of the neighboring sub-bands. This is viewed even more clearly in the second example, illustrated in FIGS. 13 and 14. To obtain a smoother filtering profile, it is possible to filter several sub-bands in an adaptive way, as is shown in FIG. 13.

A ¾ band filter is once again the desired result to be obtained. The sub-band $SB_3$ is, therefore, still canceled. The sub-band $SB_2$ again undergoes a low-pass filtering, but one that is more attenuated, for example, by a filter having coefficients [⅛, ¼, ⅛]. This attenuation naturally means a modification of the aliasing terms $131_1$ to $131_3$ will occur. To obtain a perfect compensation of these terms, it is therefore necessary to enhance the filtering profile of the sub-band $SB_1$. The sub-band $SB_1$ is therefore be subjected to a high-pass filtering of a filter having coefficients $[-\frac{1}{8}, \frac{3}{4}, -\frac{1}{8}]$ so that the aliasing terms $132_1$ to $132_3$ are compensated for with the aliasing terms $131_1$ to $131_3$ of the sub-band $SB_2$.

Figure 14:
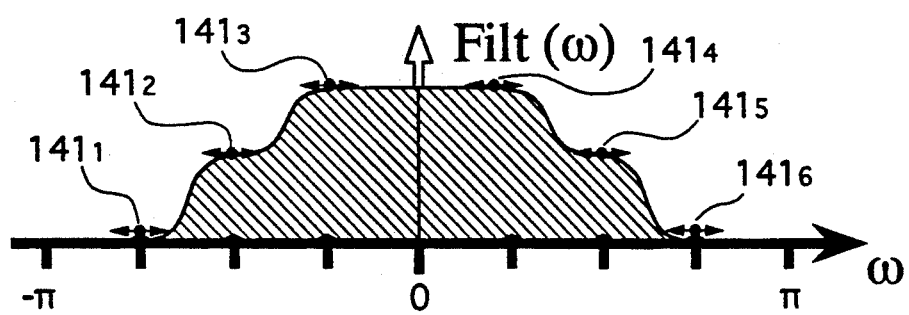

The spectrum of the reconstructed signal, after synthesis filtering and addition, is shown in FIG. 14. It can be viewed that there is obtained a low-pass filter profile of little selectivity, and which is undisturbed (or very slightly disturbed) by aliasing terms.

In the above-discussed examples of the method of the present invention, it can be clearly seen that filtering of each sub-band is not done independently but rather, is dependent of the filtering applied to the neighboring sub-bands. It should be noted that to obtain an overall filter of the low-pass type as illustrated in FIG. 14, a high-pass filtering is applied to the sub-band $SB_1$. This is due to the reversal of spectrum undergone by certain bands as a result of the sub-sampling (as shown by the direction of the hatched lines in the various Figures).

Certain transformations correct this effect by changing the sign of one out of every two points in the spectrally reversed sub-bands, thus having the effect of "setting the spectrum upright again". It is therefore necessary to verify this point before any implementation.

An advantageous approach to implementing the method of the invention ensures that the overall filtering profile has horizontal tangents in the frequency zones $141_1$ to $141_6$, as seen in FIG. 14, which are transient between the various transformation filters. Once this is done, it is easy to find the filters to be applied to the various sub-bands in order to obtain the general shape that is sought. If the condition of horizontal tangents is met, these filters to be applied to the sub-bands actually have a horizontal tangent at the various frequency positions 0 modulo $\pi$. The different aliasing terms are then compensated for without any problem.

To obtain good results, it is preferable for the filters used in the transformation into sub-bands be highly selective, so as to have only main aliasing terms present in the sub-bands. Because the use of highly selective filters is assumed, the secondary aliasing terms are not compensated for in the preferred embodiment described.

The invention can be easily implemented in hardware. Since the sub-bands are sub-sampled signals, the clock frequency of the processing operations applied to the sub-bands is reduced in relation to the frequency of the input signal. Furthermore, many of the well known transformations into sub-bands (DCT, FFT, PQMF, QMF etc.) may be obtained by means of fast algorithms.

Additionally, it is quite possible, and even advantageous, to choose very simple filters to filter the sub-bands. Thus, the filters obtained by the linear combination of a low-pass filter having coefficients [¼, ½, ¼] and of the identity filter having coefficients [0, 1, 0] gives very good results. These filters have the expression $[0.25*\alpha, 0.5*\alpha+\beta, 0.25*\alpha]$. The horizontal tangent constraint gives the relationships that should be mutually verified by the various real coefficients $\alpha$ and $\beta$.

Similarly, in the two-dimensional example the linear combinations of the four identity filters (ID), low-pass in X (PB_X), low-pass in Y (PB_Y) and high-pass in XY (PH_XY) illustrated by the following table I give excellent results.

TABLE I

| | | | |
|---|---|---|---|
| ID = 1/16* | 0 | 0 | 0 |
| | 0 | 16 | 0 |
| | 0 | 0 | 0 |

| | | | |
|---|---|---|---|
| PB_X = 1/16* | 0 | 0 | 0 |
| | 4 | 8 | 4 |
| | 0 | 0 | 0 |

| | | | |
|---|---|---|---|
| PB_Y = 1/16* | 0 | 4 | 0 |
| | 0 | 8 | 0 |
| | 0 | 4 | 0 |

| | | | |
|---|---|---|---|
| PH_XY = 1/16* | 1 | −2 | 1 |
| | −2 | 4 | −2 |
| | 1 | −2 | 1 |

The same principle can be extended to multidimensional cases.

The advantage of the filters described above is that they are of very small size, they work on sub-sampled signals, and they can be very easily installed in hardware. Furthermore, if the coefficients of the various linear combinations are well chosen, the filters can be installed by using only additions and bit shifting. Hence, they can be implemented without multiplication.

It is also clear that filters of greater complexity may be used. Referring now to FIGS. 16 to 20, a detailed description shall be given of a mode of carrying out the method already described with reference to FIG. 9, with the criterion of horizontal tangents implemented.

Figure 16:
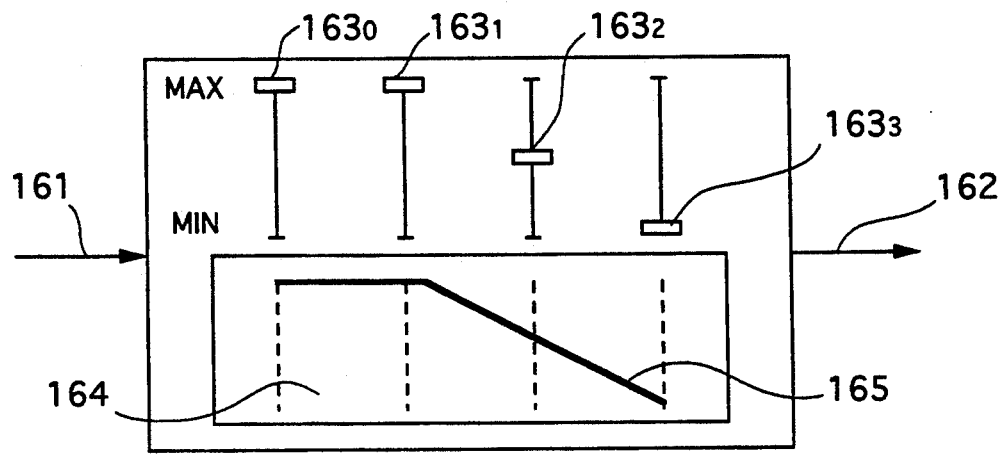
FIG. 16 is a diagrammatic representation of a sound signal equalizer.

As an example, given by way of a simple illustration, consider the sound signal equalizer shown schematically in FIG. 16. This equalizer receives a source signal 161 at its input and delivers an equalized output signal 162. It has a set of potentiometers $163_0$ to $163_3$, each corresponding to a frequency band. Each of these potentiometers $163_0$ to $163_3$ may be shifted between two terminals, "Max" and "Min", corresponding respectively to the preservation and to the elimination of the corresponding sub-band. A display unit 164, for example a liquid crystal display unit, can be used to view the filter profile determined by means of the potentiometers. Though this example has been restricted to an equalizer with four potentiometers, for the sake of homogeneity with the examples already described, it is clear that such an equalizer would normally include a greater number of potentiometers enabling a fine tuning of equalization. Furthermore, in the case of a stereophonic equalizer, the assembly described above would consist of two identical units to process both stereophonic signals in parallel.

Figure 18:
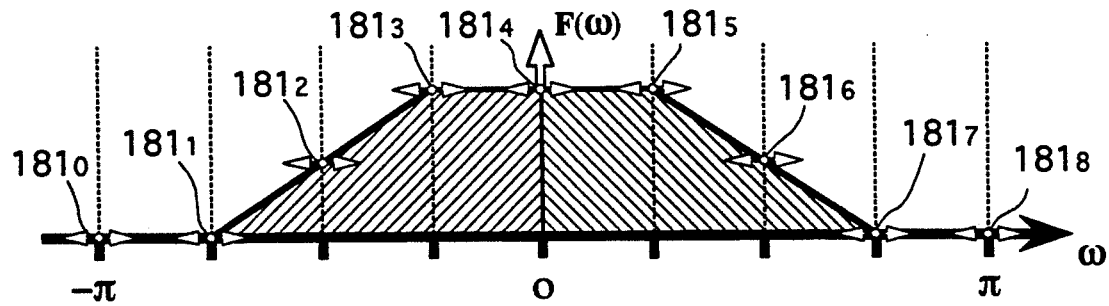
FIG. 18 is a diagrammatic representation of the overall filtering profile shown in FIG. 17, with horizontal tangent constraints in accordance with preferred embodiments of the present invention.

In the example of FIG. 16, potentiometers $163_0$ to $163_3$ are used to define a low-pass filter, as presented in display 165 by display unit 164. The processing is done by the equalizer as follows. First, at step 155 of the method shown in FIG. 15, the overall filtering profile is determined. Overall filtering profile $F(\omega)$ shown in FIG. 17 corresponds to adjustments to the equalizer's potentiometers. Overall filtering profile $F(\omega)$ is a reference profile or a desired profile. On the basis of reference profile $F(\omega)$ the partial profiles designed for filtering of each sub-band are determined as shown in FIG. 15 as step 157. This step may be divided into three sub-steps:

First, as shown in FIG. 18, points $181_0$ to $181_8$ are identified which correspond to points where the horizontal tangent constraint has to be verified. Points $181_0$ to $181_8$ correspond to the limits of each sub-band and particularly to the points at which main aliasing terms appear.

Figure 17:
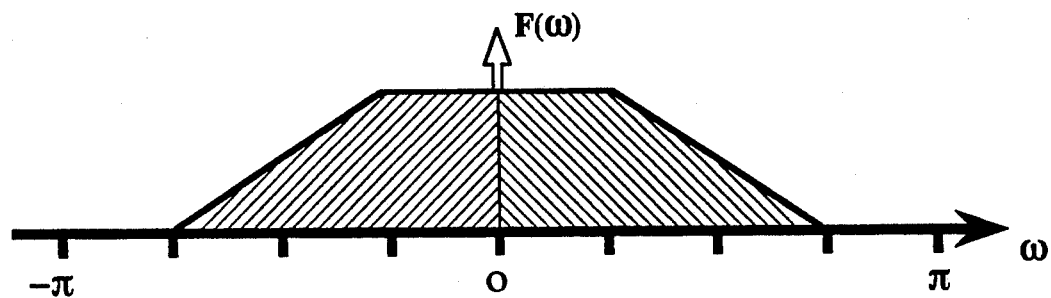
FIG. 17 is a diagrammatic representation of an overall filtering profile of the equalizer shown in FIG. 16.
Figure 19:
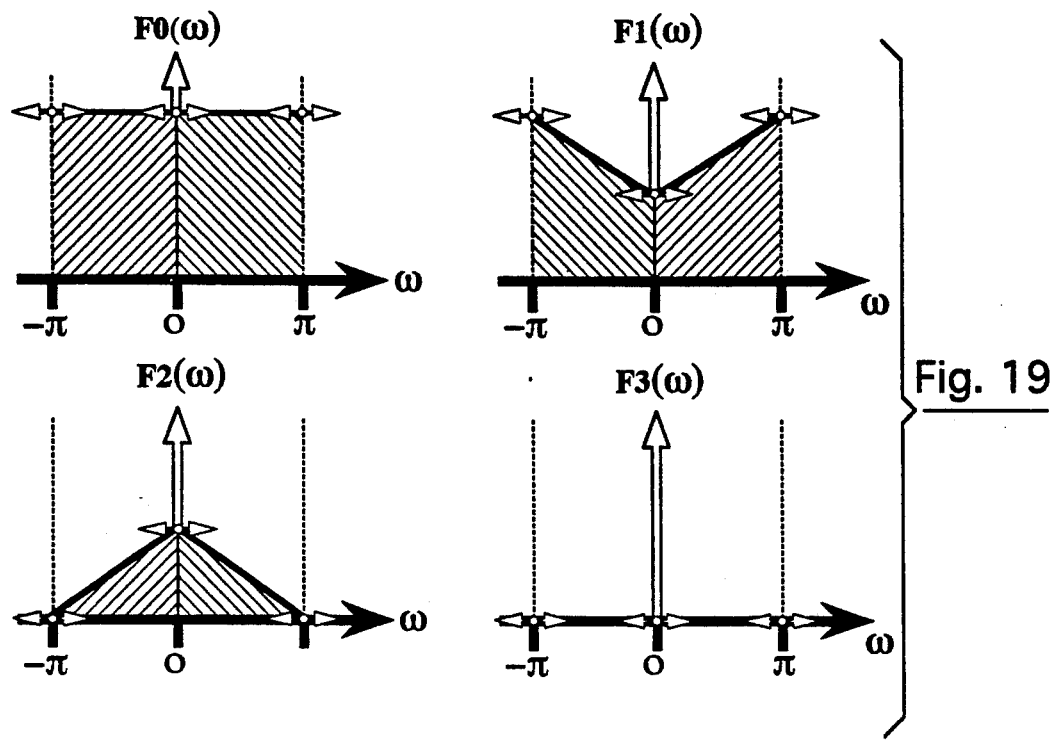
FIG. 19 is a diagrammatic representation of desired partial filtering profiles corresponding to the overall filtering profile shown in FIG. 17.

Second, the desired partial profile $F0(\omega)$ to $F3(\omega)$ for each sub-band corresponding to the overall profile $F(\omega)$ of FIG. 17 is determined as shown in FIG. 19. As described above, odd-order sub-bands $F1(\omega)$ and $F3(\omega)$ undergo a frequency inversion due to the sub-sampling.

Figure 20:
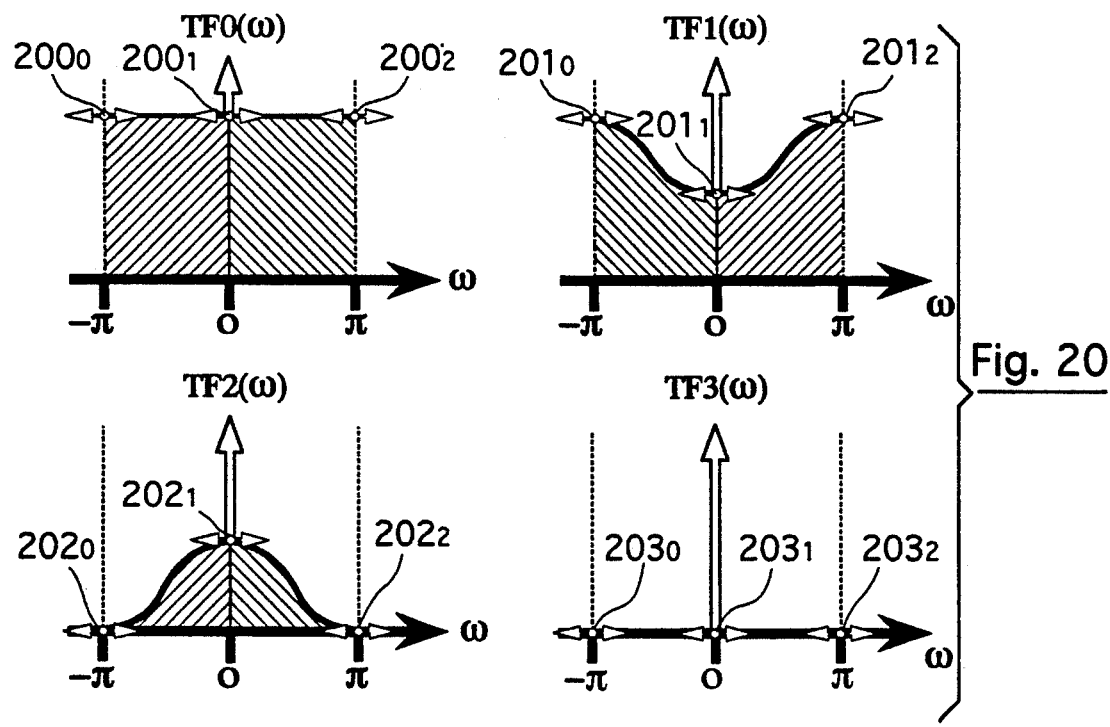
FIG. 20 is a diagrammatic representation of approximate partial filtering profiles corresponding to the overall filtering profile of FIG. 17, the approximate partial filtering profiles being implemented with available filters.

Third, as shown in FIG. 20, a search is performed among available filters to find the partial profiles $TF0(\omega)$ to $TF3(\omega)$ that are closest to the ideal profiles $F0(\omega)$ to $F3(\omega)$ of FIG. 19. More specifically, each of these partial profiles is chosen such that:
the filter approximates the desired profile; and
the filter shows a horizontal tangent at the points 0 and $\pi$ modulo $2\pi$ ($200_0$ to $200_2$; $201_0$ to $201_2$; $202_0$ to $202_2$; $203_0$ to $203_2$).

In the previously mentioned example of such an approximation using filters with three coefficients having the form [0.25*$\alpha$, .0.05*$\alpha+\beta$, 0.25*$\alpha$], the search for partial profiles consists of determining the values $\alpha$ and $\beta$ which fulfill the two above-mentioned criteria.

In this example, the search for partial profiles is particularly simple. The values at the points 0 and $\pi$ directly specify the values $\alpha$ and $\beta$. More specifically, the value at the point 0 gives the sum $\alpha+\beta$ and the value at the point $\pi$ gives $\beta$.

Should there be only a finite bank of filters available, the choice made is naturally that of the closest values $\alpha$ and $\beta$. Therefore, in the example of FIG. 20, it is possible to ascertain that the filters already described with reference to FIG. 13 are recovered, indicating the same low-pass filtering, as shown in the following table:

| Sub-band | $\alpha+\beta$ | $\beta$ | $\alpha$ | Filter |
|---|---|---|---|---|
| $TF0(\omega)$ | 1 | 1 | 0 | [0; 1; 0] |
| $TF1(\omega)$ | ½ | ½ | -½ | [-½; ½; -½] |
| $TF2(\omega)$ | ½ | 0 | ½ | [½; ½; ½] |
| $TF3(\omega)$ | 0 | 0 | 0 | [0; 0; 0] |

These different partial filters are then applied to the corresponding sub-bands, as illustrated in FIG. 13. The reconstructed signal then has the spectrum shown in FIG. 14.

The overall filtering profile of FIG. 14 is therefore the profile that is actually desired to correspond to the reference profile of FIG. 16. Naturally, in accordance with the aim of the invention, it does not show any aliasing.

Although the present invention has been described with reference to preferred embodiments, workers skilled in the art will recognize that changes may be made in form and detail without departing from the spirit and scope of the invention.

What is claimed is:

1. A method of filtering a digital source signal comprising:
    transforming the digital source signal from a temporal domain into a frequency domain to obtain at least two frequency sub-bands in the frequency domain;
    defining an overall filtering profile corresponding to a filtering operation designed to filter the digital source signal;
    determining a set of neighboring partial filtering profiles based upon the overall filtering profile, each partial filtering profile corresponding to a respective frequency sub-band, at least one partial filtering profile being a function of at least one other of the neighboring partial filtering profiles;
    filtering each frequency sub-band based upon a corresponding partial filtering profile, at least two filtered frequency sub-bands having aliasing terms based upon the corresponding partial filtering profiles;
    transforming filtered frequency sub-bands from the frequency domain into filtered temporal domain signals; and
    reconstructing the filtered temporal domain signals to form an output signal, the output signal corresponding substantially to a filtered digital source signal, the step of reconstructing including at least partially compensating aliasing terms existing in at least one filtered frequency sub-band based upon the at least one partial filtering profile with aliasing terms existing in at least one other filtered frequency sub-band based upon at least one other neighboring partial filtering profile.

2. The method of claim 1 wherein determining a set of partial filtering profiles comprises:
    determining at least one partial filtering profile as a function of at least one neighboring partial filtering profile such that aliasing terms remaining in a filtered frequency sub-band are substantially eliminated during reconstruction by aliasing terms remaining in neighboring filtered frequency sub-bands.

3. The method of claim 2 wherein the output signal has a continuous spectrum.

4. The method of claim 2, wherein determining a set of partial filtering profiles further comprises:
    enhancing at least one partial filtering profile so that it has substantially horizontal tangents at various frequency positions 0 modulo $\pi$.

5. The method of claim 1 wherein transforming the digital source signal from the temporal domain into the frequency domain comprises:
    transforming the digital source signal from the temporal domain into the frequency domain with a bank of highly frequency selective analysis filters.

6. The method of claim 1 wherein transforming filtered frequency sub-bands from the frequency domain into filtered temporal domain signals comprises:

transforming filtered frequency sub-bands from the frequency domain into filtered temporal domain signals with a bank of highly frequency selective synthesis filters.

7. The method of claim 1 wherein determining a set of partial filtering profiles includes:

linearly combining at least one basic filter belonging to a set of at least one predefined basic filter.

8. A system for filtering a digital source signal, the system comprising:

means for transforming the digital source signal from a temporal domain signal into at least two frequency domain sub-bands;

means for defining an overall filtering profile corresponding to a filtering operation designed to filter the digital source signal;

means for determining a set of neighboring partial filtering profiles based upon the overall filtering profile, each partial filtering profile corresponding to a respective frequency sub-band, at least one partial filtering profile being a function of at least one other of the neighboring partial filtering profiles;

means for filtering each frequency sub-band based upon a corresponding partial filtering profile, at least two filtered frequency sub-bands having aliasing terms based upon the corresponding partial filtering profiles;

means for transforming filtered frequency sub-bands from the frequency domain into filtered temporal domain signals; and means for reconstructing the filtered temporal domain signals to form an output signal, the output signal corresponding substantially to a filtered digital source signal, wherein reconstructing the filtered temporal domain signals to form the output signal includes at least partially compensating aliasing terms existing in at least one filtered frequency sub-band based upon the at least one partial filtering profile with aliasing terms existing in at least one other filtered frequency sub-band based upon at least one other neighboring partial filtering profile.

* * * * *

UNITED STATES PATENT AND TRADEMARK OFFICE
CERTIFICATE OF CORRECTION

PATENT NO. : 5,327,366

DATED : July 5, 1994

INVENTOR(S) : Joël Mau

It is certified that error appears in the above-indentified patent and that said Letters Patent is hereby corrected as shown below:

Col. 1, line 35, delete "and to many other fields,"

Signed and Sealed this

Twenty-ninth Day of November, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,327,366
DATED : July 5, 1994
INVENTOR(S) : Joël Mau

It is certified that error appears in the above-indentified patent and that said Letters Patent is hereby corrected as shown below:

On the Title Page of the Patent, delete [73] Assignee: France Telecom and Teldiffusion de France S.A., France insert [73] Assignee: France Telecom and Telediffusion de France S.A., France Signed and Sealed this Seventh Day of February, 1995

Attest:

BRUCE LEHMAN

Attesting Officer

Commissioner of Patents and Trademarks